United States Patent
Honda et al.

(10) Patent No.: US 11,795,356 B2
(45) Date of Patent: Oct. 24, 2023

(54) ADHESIVE COMPOSITION AND SEMICONDUCTOR DEVICE PRODUCTION METHOD

(71) Applicant: Resonac Corporation, Tokyo (JP)

(72) Inventors: Kazutaka Honda, Tokyo (JP); Keiko Ueno, Tokyo (JP)

( * ) Notice: Subject to any disclaimer, the term of this patent is extended or adjusted under 35 U.S.C. 154(b) by 332 days.

(21) Appl. No.: 17/267,023

(22) PCT Filed: Aug. 14, 2018

(86) PCT No.: PCT/JP2018/030299
§ 371 (c)(1),
(2) Date: Feb. 9, 2021

(87) PCT Pub. No.: WO2020/035906
PCT Pub. Date: Feb. 20, 2020

(65) Prior Publication Data
US 2021/0309897 A1     Oct. 7, 2021

(51) Int. Cl.
*C09J 179/08* (2006.01)
*C09J 7/35* (2018.01)
(Continued)

(52) U.S. Cl.
CPC ............. *C09J 179/08* (2013.01); *C09J 7/10* (2018.01); *C09J 7/35* (2018.01); *C09J 7/385* (2018.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 25/0657* (2013.01); *H01L 2224/16227* (2013.01); *H01L 2224/17181* (2013.01); *H01L 2224/2919* (2013.01);
(Continued)

(58) Field of Classification Search
CPC .............. C09J 2203/326; C09J 2433/00; C09J 2479/08; C09J 5/00; C09J 179/08; C09J 7/10; C08L 33/04; H01L 21/563; H01L 2224/73204; H01L 2224/16245; H01L 2225/06541
USPC ......................................... 257/737
See application file for complete search history.

(56) References Cited

FOREIGN PATENT DOCUMENTS

| CN | 103858217 | 6/2014 |
|---|---|---|
| CN | 106085100 | 11/2016 |

(Continued)

OTHER PUBLICATIONS

Masuko et al., (CN-102112568-A), "Adhesive Composition, Film-like Adhesive, Adhesive Sheet And Semiconductor Device", Jun. 9, 2011, pp. 1-25.*

(Continued)

*Primary Examiner* — Jasmine J Clark
(74) *Attorney, Agent, or Firm* — SOEI PATENT & LAW FIRM

(57) ABSTRACT

An adhesive composition contains a resin component, a thermal crosslinking agent, and a curing agent, in which the resin component contains a resin having a maleimide group. In a method for producing a semiconductor device having a plurality of connection units for connecting a semiconductor chip and a wiring circuit substrate to each other, or for connecting a plurality of semiconductor chips to each other, a first connection unit is electrically connected to a second connection unit, and at least a portion of the first and second connection units is sealed using the adhesive composition.

9 Claims, 4 Drawing Sheets

(a)

(b)

(51) Int. Cl.
  *C09J 7/38* (2018.01)
  *C09J 7/10* (2018.01)
  *H01L 23/00* (2006.01)
  *H01L 25/065* (2023.01)
(52) U.S. Cl.
  CPC .............. *H01L 2224/32225* (2013.01); *H01L 2224/33181* (2013.01); *H01L 2224/73204* (2013.01); *H01L 2225/06513* (2013.01); *H01L 2225/06517* (2013.01)

(56) References Cited

FOREIGN PATENT DOCUMENTS

| | | |
|---|---|---|
| CN | 106471077 | 3/2017 |
| CN | 107353855 | 11/2017 |
| JP | 2007-131716 | 5/2007 |
| JP | 2008-294382 | 12/2008 |
| JP | 2016-196557 | 11/2016 |
| JP | 2016-210851 | 12/2016 |
| JP | 2017-002181 | 1/2017 |
| JP | 2017-047686 | 3/2017 |
| JP | 2018-028078 | 2/2018 |
| JP | 2018-083893 | 5/2018 |
| JP | 2018-172529 | 11/2018 |
| KR | 10-2014-0068928 | 6/2014 |
| TW | 201321488 | 6/2013 |
| WO | 2013/035205 | 3/2013 |
| WO | 2013/035206 | 3/2013 |
| WO | 2016/031552 | 3/2016 |
| WO | 2016/031553 | 3/2016 |
| WO | 2017/027482 | 2/2017 |

OTHER PUBLICATIONS

Murakami et al., (JP-2016102215-A) "Adhesive Composition and Adhesive Film Using the Same", Jun. 2, 2016, pp. 1-15.*
International Preliminary Report on Patentability with Written Opinion dated Feb. 25, 2021 for PCT/JP2018/030299.
International Search Report dated Oct. 9, 2018 for PCT/JP2018/030299.

* cited by examiner (a)

(b)

(a)

(b)

(c)

ADHESIVE COMPOSITION AND SEMICONDUCTOR DEVICE PRODUCTION METHOD

CROSS-REFERENCE TO RELATED APPLICATIONS

This application is a 35 U.S.C. § 371 national phase application of PCT/JP2018/030299, filed on Aug. 14, 2018.

TECHNICAL FIELD

The present invention relates to an adhesive composition and a method for producing a semiconductor device.

BACKGROUND ART

Conventionally, in order to connect semiconductor chips with substrates, a wire bonding system of using fine metal wires such as gold wires has been widely applied. On the other hand, in an effort to cope with the demands for function enhancement, increased integration, increased speed, and the like in regard to semiconductor devices, a flip chip connection system (FC connection system) in which conductive protrusions called bumps are formed on a semiconductor chip or a substrate to directly connect between the semiconductor chip and the substrate is becoming widespread.

Regarding the flip chip connection system, for example, a method of performing metal joining by using solder, tin, gold, silver, copper, or the like; a method of performing metal joining by applying ultrasonic vibration; a method of maintaining mechanical contact by the contractile force of a resin; and the like are known. Among these, as the flip chip connection system, a method of performing metal joining by using solder, tin, gold, silver, copper, or the like is generally used from the viewpoint of the reliability of connection units.

Furthermore, with regard to the connection between a semiconductor chip and a substrate, a COB (Chip On Board) type connection system, which is frequently used for BGA (Ball Grid Array), CSP (Chip Size Package), and the like, is also a flip chip connection system. The flip chip connection system is also widely used for a COC (Chip On Chip) type connection system, in which semiconductor chips are interconnected by forming bumps or wirings on the semiconductor chips (see, for example, Patent Literature 1).

With regard to area array type semiconductor packages that are used for CPUs, MPUs and the like, function enhancement is strongly required. Specific requirements include an increase in the size of semiconductor chips, an increase in the number of pins (bumps and wirings), an increase in the density of pitches and gaps, and the like.

Regarding semiconductor packages for which further size reduction, thickness reduction, or function enhancement is strongly required, chip stack type package in which the above-mentioned connection systems are laminated or multi-staged, POP (Package On Package), TSV (Through-Silicon Via), and the like are also beginning to be widely spread. In such lamination or multi-staging technologies, since semiconductor chips and the like are three-dimensionally disposed, semiconductor packages can be made smaller as compared to the technologies in which semiconductor chips and the like are two-dimensionally disposed. Furthermore, such technologies are attracting attention as next-generation semiconductor wiring technologies because these technologies are effective for enhancing semiconductor performance, reducing noise, reducing the mounting area, saving power, and the like. These technologies are also effective for enhancing semiconductor performance, reducing noise, reducing the mounting area, saving power, and the like and are attracting attention as next-generation semiconductor wiring technologies.

CITATION LIST

Patent Literature

Patent Literature 1: JP No. 2008-294382

SUMMARY OF INVENTION

Technical Problem

In semiconductor packages, as function enhancement, increased integration, increased speed, and the like progress, it is necessary to narrow the pitches between wirings and to make finer wirings. However, in semiconductor packages where narrowing of pitches and making finer wirings are in progress, there is a problem that electric energy is converted to heat and is lost due to the adhesive material used. Particularly, in semiconductor packages that require high-frequency signals, energy loss becomes large, and inefficiency becomes noticeable. As an index representing the extent of electric energy loss, the dielectric loss tangent (DF value) is known. In order to suppress loss of electric energy through heat, it is important to lower the dielectric loss tangent (DF value) of the adhesive material.

Thus, it is a principal object of the present invention to provide an adhesive composition that can sufficiently reduce the dielectric loss tangent (DF value).

Solution to Problem

According to an aspect of the present invention, there is provided an adhesive composition containing a resin component, a thermal crosslinking agent, and a curing agent, wherein the resin component includes a resin having a maleimide group. Such an adhesive composition can sufficiently reduce the dielectric loss tangent (DF value).

The thermal crosslinking agent may include an acrylic resin. The acrylic resin may be solid at 25° C.

The curing agent may include a thermal radical generator. The thermal radical generator may be an organic peroxide.

The adhesive composition may be in a film form. Incidentally, in the present specification, a film-shaped adhesive composition may be referred to as "film-shaped adhesive".

The adhesive composition may be used for production of a semiconductor device. The present invention may also relate to an application of a composition containing a resin component, a thermal crosslinking agent, and a curing agent, in which the resin component includes a resin having a maleimide group, as an adhesive used for the production of a semiconductor device, or to an application of the composition for the production of an adhesive.

The adhesive composition may be used for sealing of a connection unit in a method for producing a semiconductor device in which the respective connection units of a semiconductor chip and a wiring circuit substrate are electrically connected to each other, or a semiconductor device in which the respective connection units of a plurality of semiconductor chips are electrically connected to each other. The present invention also relate to an application of a composition containing a resin component, a thermal crosslinking agent, and a curing agent, in which the resin component includes a resin having a maleimide group, as an adhesive used for sealing of a connection unit, or to an application of the composition for the production of an adhesive, in a method for producing a semiconductor device in which the respective connection units of a semiconductor chip and a wiring circuit substrate are electrically connected to each other, or a semiconductor device in which the respective connection units of a plurality of semiconductor chips are electrically connected to each other.

According to another aspect, the present invention provides a method for producing a semiconductor device in which the respective connection units of a semiconductor chip and a wiring circuit substrate are electrically connected to each other, or a semiconductor device in which the respective connection units of a plurality of semiconductor chips are electrically connected to each other, the method comprising a step of sealing at least a portion of the connection units using the above-mentioned adhesive composition.

Advantageous Effects of Invention

According to the present invention, an adhesive composition that can sufficiently reduce the dielectric loss tangent (DF value) can be provided. Furthermore, a method for producing a semiconductor device using such an adhesive composition can be provided. A semiconductor device obtained by using such an adhesive composition has excellent reflow resistance.

DESCRIPTION OF EMBODIMENTS

Figure 1:
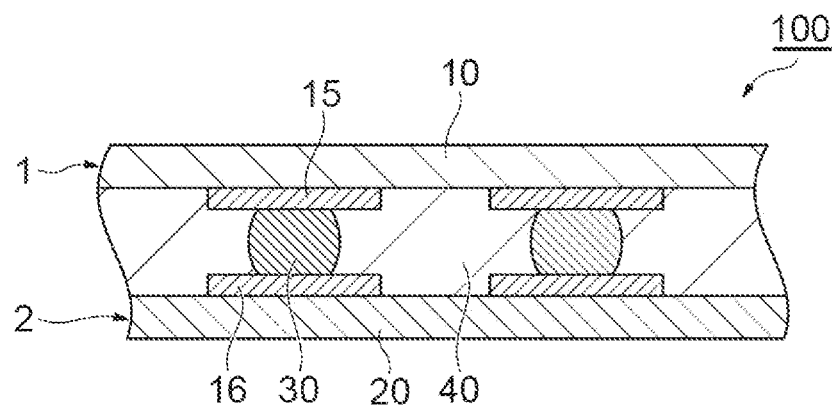
FIG. 1 is a schematic cross-sectional view illustrating an embodiment of a semiconductor device.
Figure 1:
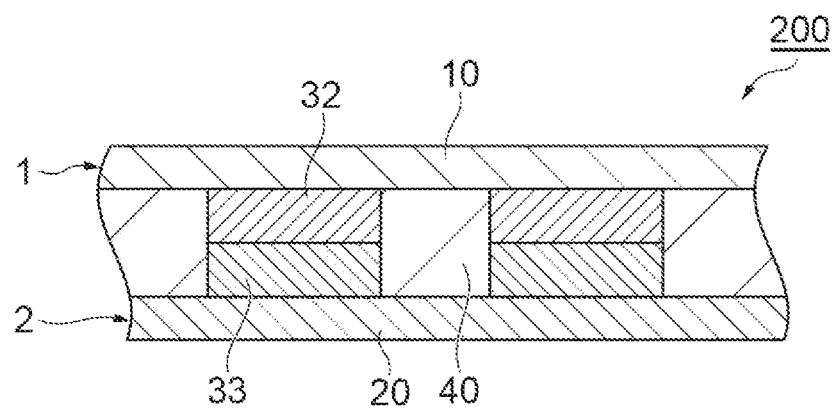

Hereinafter, suitable embodiments of the present invention will be described in detail, with reference to the drawings as necessary. Incidentally, identical reference numerals will be assigned to identical or equivalent parts, and any duplicate description will not be repeated. Furthermore, unless particularly stated otherwise, the positional relationship such as up and down, and right and left, is to be based on the positional relationship illustrated in the drawings. In addition, the dimensional ratios of the drawings are not limited to the depicted ratios.

[Adhesive Composition]

The adhesive composition according to the present embodiment contains a resin component (hereinafter, may be referred to as "component (a)"), a thermal crosslinking agent (hereinafter, may be referred to as "component (b)"), and a curing agent (hereinafter, may be referred to as "component (c)"). The adhesive composition according to the present embodiment is thermosetting, and the adhesive composition can go through a semi-cured (stage B) state and then reach a completely cured product (stage C) state after a curing treatment.

<Component (a): Resin Component>

The component (a) is preferably a component having a weight average molecular weight of 10000 or more. The component (a) includes a resin having a maleimide group (hereinafter, may be referred to as "component (a1)"). As the component (a) includes the component (a1), the dielectric loss tangent (DF value) can be reduced for a cured product of the resulting adhesive composition.

(Component (a1): Resin Having Maleimide Group)

The component (a1) is not particularly limited so long as it is a resin having a maleimide group. The weight average molecular weight of the component (a1) is preferably 10000 or more. The component (a1) may be, for example, a resin having at least two maleimide groups and a divalent hydrocarbon group (hereinafter, this resin may be referred to as "bismaleimide resin").

A bismaleimide resin has two maleimide groups represented by the following Formula (III):

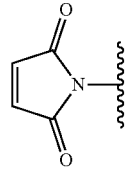

(III)

The bismaleimide resin is, for example, a resin component represented by the following Formula (IV):

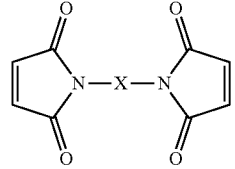

(IV)

In Formula (IV), X represents a divalent linking group including a divalent hydrocarbon group.

The divalent hydrocarbon group included in the linking group represented by X may be either a saturated hydrocarbon group or an unsaturated hydrocarbon group. The divalent hydrocarbon group may be either chain-like or cyclic, and the chain-like divalent hydrocarbon group may be either linear or branched. The cyclic unsaturated hydrocarbon group may be an aromatic hydrocarbon group. The divalent linking group may include two or more kinds of these divalent hydrocarbon groups.

The divalent hydrocarbon group preferably includes a chain-like hydrocarbon group, and more preferably includes a chain-like alkylene group having a main chain with a carbon number of 4 or more, from the viewpoint that it is possible to increase the flexibility of the adhesive composition, and the handleability (tackiness, cracking, powder fall, and the like) and strength of a film-shaped adhesive produced from the adhesive composition.

The chain-like alkylene group having a main chain with a carbon number of 4 or more is represented by the formula: $-(CR^aR^b)_m-$ (where m represents an integer of 4 or greater; and $R^a$ and $R^b$ each independently represent a hydrogen atom or an alkyl group having a carbon number of less than m). The carbon number (m) of the main chain of this alkylene group may be 4 or more, or 6 or more, and the carbon number (m) may be 20 or less, 15 or less, or 10 or less.

The carbon number of the divalent hydrocarbon group may be 8 or more, 10 or more, or 15 or more, and may be 300 or less, 250 or less, 200 or less, 100 or less, 70 or less, or 50 or less, from the viewpoint that the molecular structure of the bismaleimide resin is easily made three-dimensional, and the free volume of the polymer can be increased to lower the density, that is, to lower the dielectric constant. The carbon number of the divalent hydrocarbon group may be 8 to 300, 8 to 250, 8 to 200, or 8 to 100, from a similar viewpoint. The divalent hydrocarbon group may be an alkylene group which may have a branch with a carbon number of 8 to 300, 8 to 250, 8 to 200, or 8 to 100; an alkylene group which may have a branch with a carbon number of 10 to 70; or an alkylene group which may have a branch with a carbon number of 15 to 50.

According to an embodiment, the divalent hydrocarbon group includes a group represented by the following Formula (II), from the viewpoint of more effectively enhancing the high-frequency characteristics.

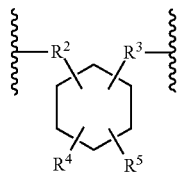

In Formula (II), IV and $R^3$ each independently represent an alkylene group; and $R^4$ and $R^5$ each independently represent an alkyl group.

The carbon number of the alkylene group represented by $R^2$ and $R^3$ may be 4 to 50, 5 to 25, 6 to 10, or 7 to 10, from the viewpoints of further enhancing pliability and the ease of synthesis. The alkylene group represented by $R^2$ and $R^3$ may be the above-mentioned chain-like alkylene group having a main chain with a carbon number of 4 or more.

The carbon number of the alkyl group represented by $R^4$ may be 4 to 50, 5 to 25, 6 to 10, or 7 to 10, from the viewpoint of further enhancing pliability and the ease of synthesis. The carbon number of the alkyl group represented by $R^5$ may be 2 to 50, 3 to 25, 4 to 10, or 5 to 8, from the viewpoint of further enhancing pliability and the ease of synthesis.

The bismaleimide resin may have a plurality of divalent hydrocarbon groups, from the viewpoint of more effectively enhancing the high-frequency characteristics and elongation percentage. In this case, a plurality of the divalent hydrocarbon groups may be identical with or different from one another. The bismaleimide resin may have 2 to 40 units, 2 to 20 units, or 2 to 10 units of the divalent hydrocarbon group.

Examples of the divalent hydrocarbon group may include alkylene groups such as a nonylene group, a decylene group, an undecylene group, a dodecylene group, a tetradecylene group, a hexadecylene group, an octadecylene group, a nonadecylene group, an eicosylene group, a henicosylene group, a docosylene group, a tricosylene group, a tetracosylene group, a pentacosylene group, a hexacosylene group, a heptacosylene group, an octacosylene group, a nonacosylene group, and a triacontylene group; arylene groups such as a benzylene group, a phenylene group, and a naphthylene group; arylene-alkylene groups such as a phenylene-methylene group, a phenylene-ethylene group, a benzyl-propylene group, a naphthylene-methylene group, and a naphthylene-ethylene group; and arylene-dialkylene groups such as a phenylene-dimethylene group and a phenylene-diethylene group.

The linking group represented by X may be composed only of the above-described divalent hydrocarbon group or may include another organic group in addition to the above-described divalent hydrocarbon group. An example of the other organic group may be a divalent organic group having at least two imide bonds.

The divalent organic group having at least two imide bonds may be, for example, a group represented by the following Formula (I):

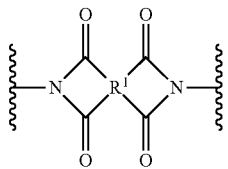

In Formula (I), $R^1$ represents a tetravalent organic group.

The tetravalent organic group represented by $R^1$ may be, for example, a hydrocarbon group from the viewpoint of handleability. The carbon number of this hydrocarbon group may be, for example, 1 to 100, 2 to 50, or 4 to 30.

This hydrocarbon group may have a substituent and may include, for example, a substituted or non-substituted siloxanyl group. Examples of the siloxanyl group include groups derived from dimethylsiloxane, methylphenylsiloxane, diphenylsiloxane, and the like.

Examples of the substituent may include an alkyl group, an alkenyl group, an alkynyl group, a hydroxyl group, an alkoxy group, a mercapto group, a cycloalkyl group, a substituted cycloalkyl group, a heterocyclic group, a substituted heterocyclic group, an aryl group, a substituted aryl group, a heteroaryl group, a substituted heteroaryl group, an aryloxy group, a substituted aryloxy group, a halogen atom, a haloalkyl group, a cyano group, a nitro group, a nitroso group, an amino group, an amide group, —C(=O)H, —C(=O)—, —S—, —S(=O)$_2$—, —OC(=O)—O—, —C(=O)—NR$^c$, —NR$^c$C(=O)—N(R$^c$)$_2$, —OC(=O)—N(R$^c$)$_2$, an acyl group, an oxyacyl group, a carboxyl group, a carbamate group, a sulfonyl group, a sulfonamide group, and a sulfuryl group. Here, $R^c$ represents a hydrogen atom or an alkyl group. Regarding these substituents, one kind or two or more kinds thereof can be selected according to the purpose, use application, and the like.

The tetravalent organic group represented by $R^1$ may be, for example, a tetravalent aromatic hydrocarbon group obtained by eliminating four hydrogen atoms from an aromatic hydrocarbon such as benzene, or a tetravalent alicyclic hydrocarbon group obtained by eliminating four hydrogen atoms from an alicyclic hydrocarbon such as cyclohexane. The tetravalent organic group represented by $R^1$ may also be a tetravalent aromatic hydrocarbon group or may be a tetravalent group obtained by eliminating four hydrogen atoms from benzene, from the viewpoint of having excellent high-frequency characteristics.

The divalent organic group having at least two imide bonds may be a group represented by the following Formula (V):

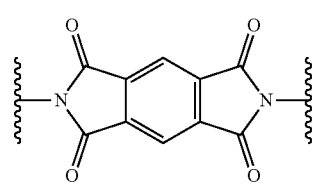

The divalent organic group having at least two imide bonds may also be a group represented by the following Formula (VI) or (VII), from the viewpoint of having excellent dielectric characteristics.

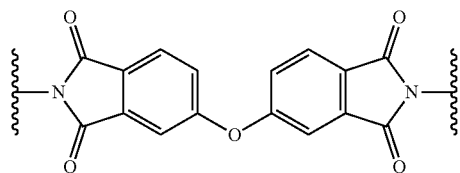

(VI)

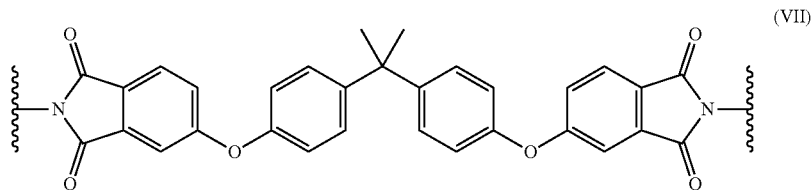

(VII)

The bismaleimide resin may have a plurality of divalent organic groups each having at least two imide bonds, from the viewpoint that the resin has excellent high-frequency characteristics, and in a case in which the adhesive composition further contains another resin, the bismaleimide resin has excellent compatibility with the other resin. In this case, the plurality of divalent organic groups may be identical with or different from one another. The bismaleimide resin may have 2 to 40 units, 2 to 20 units, or 2 to 10 units of this divalent organic group.

According to an embodiment, the bismaleimide resin may be, for example, a bismalemide resin represented by the following Formula (VIII) or may be a bismaleimide resin represented by the following Formula (IX).

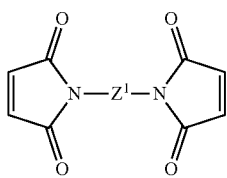

(VIII)

-continued

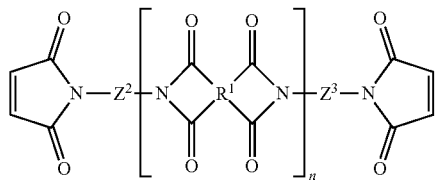

(IX)

In Formula (VIII) and Formula (IX), $Z^1$, $Z^2$, and $Z^3$ each independently represent the above-mentioned divalent hydrocarbon group; $R^1$ has the same meaning as $R^1$ in Formula (I); and n represents an integer from 1 to 10. In a case in which n is 2 or greater, a plurality of $Z^3$ may be identical with or different from one another.

Specific examples of the bismaleimide resin represented by Formula (IX) include a bismaleimide resin represented by the following Formula (A). Incidentally, the bismaleimide resin represented by Formula (A) may be a mixture in which n is 1 to 10.

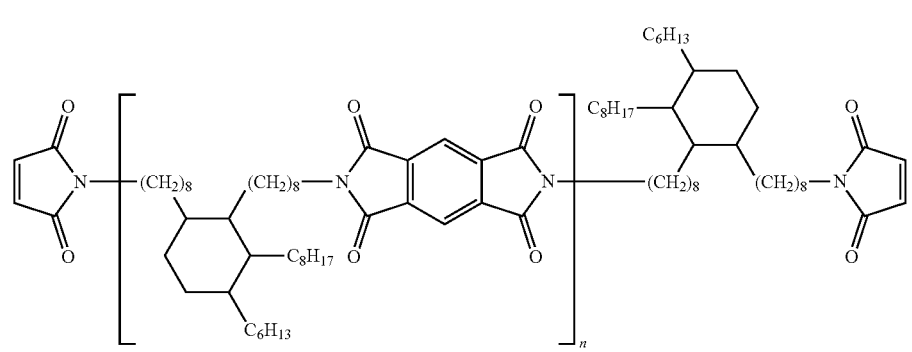

(A)

The weight average molecular weight (Mw) of the component (a1) is preferably 10000 or more. The weight average molecular weight (Mw) of the component (a1) may be 12000 or more, 14000 or more, or 16000 or more and may be 100000 or less, 50000 or less, or 20000 or less, from the viewpoint of the lamination characteristics onto a semiconductor wafer having protrusions such as bumps and pads, a chip, a substrate, and the like, and from the viewpoint of suppressing void generation.

According to the present specification, the weight average molecular weight (Mw) means a value obtained by gel permeation chromatography (GPC) method and calculated relative to polystyrene standards using a calibration curve based on polystyrene standards.

The glass transition point (Tg) of the component (a1) may be 160° C. or lower, 140° C. or lower, 120° C. or lower, or 100° C. or lower, from the viewpoint of the lamination characteristics onto a semiconductor wafer having protrusions such as bumps and pads, a chip, a substrate, and the like, and from the viewpoint of suppressing void generation. The glass transition point (Tg) of the resin having a maleimide group may be 40° C. or higher, 50° C. or higher, or 60° C. or higher, from the viewpoints of film-forming properties and film handleability (film tackiness). The glass transition point (Tg) as mentioned herein is measured using a differential scanning calorimeter (DSC) (manufactured by PerkinElmer, Inc., DSC-7 type) under the conditions of 10 mg of the component (a1), a rate of temperature increase 10° C./min, and an air atmosphere.

Regarding the component (a1), one kind of a resin having a maleimide group may be used alone, and for example, two or more kinds of resins having maleimide groups, which have different characteristics such as weight average molecular weight, may be used in combination.

The content of the component (a1) may be 60% by mass or more, 70% by mass or more, 80% by mass or more, 90% by mass or more, or 95% by mass or more, based on the total amount of the component (a). The content of the component (a1) may be 60% to 100% by mass, 70% to 100% by mass, 80% to 100% by mass, 90% to 100% by mass, or 95% to 100% by mass or more, based on the total amount of the component (a).

From the viewpoint of imparting heat resistance and enhancing the film-forming properties, the component (a) may include a resin that does not have a maleimide group (hereinafter, may be referred to as "component (a2)") to the extent that the effects of the present invention are not impaired.

(Component (a2): Resin that does not have Maleimide Group)

The component (a2) is not particularly limited so long as it is a resin that does not have a maleimide group; however, it is preferable that the component (a2) has a weight average molecular weight of 10000 or more. Examples of the component (a2) include an epoxy resin, a phenoxy resin, a polyimide resin, a polyamide resin, a polycarbodiimide resin, a cyanate ester resin, an acrylic resin, a polyester resin, a polyethylene resin, a polyethersulfone resin, a polyetherimide resin, a polyvinyl acetal resin, a urethane resin, and an acrylic rubber. These may be used singly or in combination of two or more kinds thereof. Among these, the component (a2) may include an epoxy resin, a phenoxy resin, a polyimide resin, an acrylic resin, or an acrylic rubber, from the viewpoint of having superior heat resistance and film-forming properties.

In a case in which the component (a) includes the component (a2), the content of the component (a2) may be 40% by mass or less, 30% by mass or less, 20% by mass or less, 10% by mass or less, or 5% by mass or less, based on the total amount of the component (a).

The content of the component (a) (component (a1) and component (a2)) may be 30 to 75 parts by mass or 40 to 70 parts by mass based on 100 parts by mass of the total amount of the component (a) and the component (b). When the content of the component (a) is 30 parts by mass or more based on 100 parts by mass of the total amount of the component (a) and the component (b), the film-forming properties and handleability tend to be superior. When the content of the component (a) is 75 parts by mass or less based on 100 parts by mass of the total amount of the component (a) and the component (b), there is a tendency that deterioration of reliability caused by deterioration of cured product properties can be more sufficiently prevented.

(Component (b): Thermal Crosslinking Agent)

The component (b) may be a thermosetting resin. The component (b) is preferably a component having a weight average molecular weight of less than 10000. As the component (b) having a weight average molecular weight of less than 10000 reacts with the component (c) that will be described below, curability of the adhesive composition tends to be enhanced.

Examples of the component (b) include an acrylic resin and an epoxy resin. In a case in which the component (a1) is a resin having a maleimide group and having a weight average molecular weight of 10000 or more, a resin having a maleimide group and having a weight average molecular weight of less than 10000 can also act as a thermal crosslinking agent. Among these, the component (b) may include an acrylic resin.

The acrylic resin is not particularly limited so long as it is a resin having one or more (meth)acryloyl groups in the molecule. Examples of the acrylic resin include a bisphenol A type, a bisphenol F type, a naphthalene type, a phenol novolac type, a cresol novolac type, a phenol aralkyl type, a biphenyl type, a triphenylmethane type, a dicyclopentadiene type, a fluorene type, an adamantane type, and various polyfunctional acrylic resins. These may be used singly or in combination of two or more kinds thereof. Incidentally, in the present specification, the term "(meth)acryloyl group" means either an acryloyl group or a methacryloyl group, and this also applies to other similar expressions.

The acrylic resin may be solid at room temperature (25° C.). Since voids are not easily generated in a solid form compared to a liquid form, and the viscosity (tack) of the adhesive composition in a stage B state prior to curing is low, handleability tends to be excellent (easily formed into a film shape). The acrylic resin may be, for example, a fluorene type acrylic resin that is solid at room temperature (25° C.).

The number of functional groups ((meth)acryloyl groups) carried by the acrylic resin may be 3 or less per molecule and may be 2 or 3. When the number of functional groups is 3 or less per molecule, curing sufficiently proceeds in a short period of time, and the curing reaction ratio increases (since the curing network appropriately progresses, there is a tendency that unreacted groups can be suppressed from remaining).

The epoxy resin is not particularly limited so long as it is a resin having two or more epoxy groups in the molecule. Examples of the epoxy resin include a bisphenol A type, a bisphenol F type, a naphthalene type, a phenol novolac type, a cresol novolac type, a phenol aralkyl type, a biphenyl type, a triphenylmethane type, a dicyclopentadiene type, and various polyfunctional epoxy resins. These may be used singly or in combination of two or more kinds thereof.

The mass ratio of the component (b) with respect to the component (a) (mass of component (b)/mass of component (a)) is not particularly limited; however, the mass ratio may be 0.01 to 10, 0.05 to 5, or 0.1 to 5. When the mass ratio of the component (b) with respect to the component (a) is 0.01 or more, curability is enhanced, and the adhesive force tends to be further enhanced. When the mass ratio is 10 or less, the film-forming properties tend to be superior.

(Component (c): Curing Agent)

The component (c) is not particularly limited so long as it acts mainly as a curing agent for the component (b). Examples of the component (c) include a thermal radical generator (compound generating a radical under the effect of heat) and a photoradical generator (compound generating a radical under the effect of light). Among these, from the viewpoint of handleability, the component (c) may include a thermal radical generator.

Examples of the thermal radical generator include an organic peroxide and an ago compound. Among these, from the viewpoints of handleability and storage stability, the thermal radical generator may be an organic peroxide.

Examples of the organic peroxide include a ketone peroxide, a peroxy ketal, a hydroperoxide, a dialkyl peroxide, a diacyl peroxide, a peroxydicarbonate, and a peroxy ester. These may be used singly or in combination of two or more kinds thereof. The organic peroxide may be a hydroperoxide, a dialkyl peroxide, or a peroxy ester, from the viewpoint of storage stability. Furthermore, the organic peroxide may be a hydroperoxide or a dialkyl peroxide, from the viewpoint of heat resistance. Examples of the dialkyl peroxide include dicumyl peroxide and di-tert-butyl peroxide.

In a case in which the component (b) includes an epoxy resin, examples of the component (c) may include phenolic resin-based curing agents such as phenol novolac, cresol novolac, and a phenol aralkyl resin; acid anhydride-based curing agents such as methylcyclohexane tetracarboxylic acid dianhydride, trimellitic anhydride, and pyromellitic anhydride; amine-based curing agents such as dicyandiamide, imidazole-based curing agents such as 2-phenylimidazole, 2-phenyl-4-methylimidazole, 1-benzyl-2-methylimidazole, and 1-benzyl-2-phenylimidazole; and phosphine-based curing agents such as triphenylphosphine, tetraphenylphosphonium tetraphenyl borate, and tetraphenylphosphonium tetra(4-methylphenyl)borate.

The content of the component (c) may be 0.5% to 10% by mass or 1% to 5% by mass based on the total mass of the component (b). When the content of the component (c) is 0.5% by mass or more, curing tends to proceed sufficiently. When the content of the component (c) is 10% by mass or less, there is a tendency that rapid proceeding of curing, an increase in the number of reactive sites, shortening of the molecular chain, and remaining of unreacted groups can be suppressed.

The adhesive composition may further contain a flux agent (hereinafter, may be referred to as "component (d)"), a filler (hereinafter, may be referred to as "component (e)"), and the like.

(Component (d): Flux Agent)

The component (d) is a compound exhibiting flux activity (activity of removing oxides and impurities). Examples of the component (d) include nitrogen-containing compounds having an unshared electron pair, such as imidazoles and amines; carboxylic acids, phenols, and alcohols. These may be used singly or in combination of two or more kinds thereof. Among these, the flux agent may be a carboxylic acid from the viewpoint of strongly exhibiting flux activity and enhancing connectivity. The carboxylic acid may be a monocarboxylic acid (compound having one carboxyl group), a dicarboxylic acid (compound having two carboxyl groups), or a compound having three or more carboxyl groups. Among these, the carboxylic acid may be a dicarboxylic acid such as glutaric acid.

The content of the component (d) may be 0.5 to 10 parts by mass or 1 to 7 parts by mass with respect to 100 parts by mass of the total amount of the component (a) and the component (b). When the content of the component (d) is 0.5 parts by mass or more with respect to 100 parts by mass of the total amount of the component (a) and the component (b), there is a tendency that the flux activity is likely to be exhibited more sufficiently. When the content of the component (d) is 10 parts by mass or less with respect to 100 parts by mass of the total amount of the component (a) and the component (b), there is a tendency that deterioration of reliability can be prevented more sufficiently.

(Component (e): Filler)

The viscosity of the adhesive composition, physical properties of a cured product of the adhesive composition, and the like can be controlled by the component (e). More specifically, suppression of void generation at the time of connection, reduction of the moisture absorption ratio of a cured product of the adhesive composition, and the like can be promoted. Examples of the component (e) include an inorganic filler, a resin filler, and whiskers. These may be used singly or in combination of two or more kinds thereof. It is desirable that the component (e) is insulating.

Examples of the inorganic filler include glass, silica, alumina, titanium oxide, carbon black, mica, and boron nitride. Among these, the inorganic filler may be silica, alumina, titanium oxide, or boron nitride, and may be silica, alumina, or boron nitride. Since the inorganic filler has a smaller coefficient of thermal expansion compared to the resin fillers that will be described below, lowering of the coefficient of thermal expansion of the adhesive composition is enabled. Furthermore, since there are many inorganic fillers whose particle size has been controlled as general-purpose products, the inorganic filler is also preferable in view of viscosity adjustment.

Examples of the resin filler include fillers formed from resins such as polyurethane and polyimide. Since resin fillers have smaller coefficients of thermal expansion compared to the organic components (resin component, thermal crosslinking agent, curing agent, and the like), the effect of enhancing the connection reliability is excellent. Furthermore, viscosity adjustment of the adhesive composition can be easily carried out by using a resin filler. Furthermore, the resin filler tends to have an excellent function of relieving stress as compared to inorganic fillers.

Examples of the whiskers include aluminum borate, aluminum titanate, zinc oxide, calcium silicate, magnesium sulfate, and boron nitride.

Among these, the component (e) may be an inorganic filler or a resin filler. Regarding the component (e), either of these may be used, or a mixture of both may be used, according to the use application.

The component (e) may be subjected to a surface treatment with a surface treatment agent, from the viewpoint of enhancing dispersibility and adhesive force. The surface treatment agent may be, for example, a silane coupling agent. Examples of the functional group of the silane coupling agent include a glycidyl group (epoxy group), an amino group, a phenyl group, a phenylamino group, a (meth)acryloyl group, and a vinyl group. The functional group of the silane coupling agent may be a glycidyl group, a phenylamino group, or a (meth)acryloyl group from the viewpoints of dispersibility, fluidity, and adhesive force, and the functional group may be a phenyl group or a (meth) acryloyl group from the viewpoint of storage stability.

The average particle size of the filler may be 1.5 µm or less from the viewpoint of preventing the adhesive composition from being pinched at the time of flip chip connection, and the average particle size may be 1.0 µm or less from the viewpoint of visibility (transparency).

The content of the component (e) may be 10 to 400 parts by mass or 40 to 150 parts by mass with respect to 100 parts by mass of the total amount of the component (a) and the component (b). When the content of the component (e) is 10 parts by mass or more with respect to 100 parts by mass of the total amount of the component (a) and the component (b), the film-forming properties and cured product properties (coefficient of thermal expansion and the like) tend to be further enhanced. When the content of the component (e) is 400 parts by mass or less with respect to 100 parts by mass of the total amount of the component (a) and the component (b), there is a tendency that generation of defects such as voids caused by a decrease in resin fluidity can be more sufficiently prevented.

The adhesive composition may further contain additives such as an ion scavenger, an oxidation inhibitor, a silane coupling agent, a titanium coupling agent, a leveling agent, and an ion trapping agent. These may be used singly or in combination of two or more kinds thereof. The contents of these can be appropriately set to the extent that the effects of the various additives are exhibited.

The curing reaction ratio at the time of maintaining the adhesive composition for 5 seconds at 200° C. may be 50% or higher, 80% or higher, or 90% or higher. 200° C. is a temperature lower than the solder melting temperature. When the curing reaction ratio is 50% or higher, even in a case in which the connection is achieved at a temperature higher than the solder melting temperature, solder can be prevented from scattering or flowing and causing deterioration of connection reliability. The curing reaction ratio can be determined by subjecting 10 mg of an untreated adhesive composition and 10 mg of an adhesive composition after a heat treatment (after being maintained for 5 seconds at 200° C.), both being placed in an aluminum pan, to a differential scanning calorimetric analysis using a DSC (Model DSC-7 manufactured by PerkinElmer, Inc.) in a temperature range of 30° C. to 300° C. at a rate of temperature increase of 20° C./min. Regarding the curing reaction ratio, for example, the calorific value $\Delta H$ (J/g) based on a curing reaction of an untreated sample in the differential scanning calorimetric analysis is designated as "$\Delta H1$", the calorific value $\Delta H$ (J/g) based on a curing reaction of a sample after being maintained for 5 seconds at 200° C. on a hot plate is designated as "$\Delta H2$", and the curing reaction ratio can be calculated by the following formula.

Curing reaction ratio (%)=$(\Delta H1-\Delta H2)/H1\times 100$

The adhesive composition according to the present embodiment may be used as an adhesive varnish diluted with an organic solvent. Examples of the organic solvent include aromatic hydrocarbons such as toluene, xylene, mesitylene, cumene, and p-cymene; aliphatic hydrocarbons such as hexane and heptane; cyclic alkanes such as methylcyclohexane; cyclic ethers such as tetrahydrofuran and 1,4-dioxane; ketones such as acetone, methyl ethyl ketone, methyl isobutyl ketone, cyclohexanone, and 4-hydroxy-4-methyl-2-pentanone; esters such as methyl acetate, ethyl acetate, butyl acetate, methyl lactate, ethyl lactate, and γ-butyrolactone; carbonic acid esters such as ethylene carbonate and propylene carbonate; and amides such as N,N-dimethylformamide, N,N-dimethylacetamide, and N-methyl-2-pyrrolidone. These may be used singly or in combination of two or more kinds thereof. Among these, the organic solvent may be toluene, xylene, methyl ethyl ketone, methyl isobutyl ketone, or cyclohexane, from the viewpoints of solubility and boiling point.

The solid component concentration in the adhesive varnish may be 10% to 80% by mass based on the total mass of the adhesive varnish.

The adhesive varnish can be prepared by mixing and kneading the component (a), component (b), component (c), other components, and additives, as well as an organic solvent. Mixing and kneading can be carried out by appropriately combining conventional dispersing machines such as a stirrer, a Raikai mixer, a three-roll, a ball mill, and a bead mill. Furthermore, after the adhesive varnish is prepared, air bubbles in the adhesive varnish may be removed by vacuum defoaming or the like.

The adhesive composition may be in a film form (film-shaped adhesive). A film-shaped adhesive may be in a semi-cured (stage B) state. Such a film-shaped adhesive can be formed by applying the adhesive composition on a base material film. In the case of using an adhesive varnish, the film-shaped adhesive can be formed by applying the adhesive varnish on a support film and removing the organic solvent by heating and drying the organic solvent.

The base material film is not particularly limited so long as it can endure the heating conditions at the time of volatilizing the organic solvent; however, examples include a polyester film, a polypropylene film, a polyethylene terephthalate film, a polyimide film, a polyetherimide film, a polyether naphthalate film, and a polymethylpentene film. The base material film may be a single-layer film composed only of one kind among these films or may be a multilayer film composed of two or more kinds of films.

Regarding the method of applying the adhesive varnish on a base material film, any known method can be used, and examples thereof include a knife coating method, a roll coating method, a spray coating method, a gravure coating method, a bar coating method, and a curtain coating method. The conditions for heating and drying the organic solvent are not particularly limited so long as they are conditions in which the organic solvent used is sufficiently volatilized; however, for example, the conditions may be a temperature of 50° C. to 200° C. and a duration of 0.1 to 90 minutes. When there is no influence on the voids after packaging or on the viscosity adjustment, it is preferable that the organic solvent is volatilized until the residual ratio of the organic solvent in the film-shaped adhesive reaches 1.5% by mass or less.

The thickness of the film-shaped adhesive can be appropriately adjusted according to the use application. The thickness of the film-shaped adhesive is appropriately set by the height of the bumps on the semiconductor package or the like.

The adhesive composition according to the present embodiment can be pressure-bonded at a high temperature of 200° C. or higher. Furthermore, the adhesive composition according to the present embodiment exhibits superior curability in a flip chip package in which connection is formed by melting a metal such as solder.

The adhesive composition according to the present embodiment can be suitably used for the manufacture of a semiconductor device. The adhesive composition according to the present embodiment can be suitably used for sealing of a connection unit, particularly in a method for producing a semiconductor device in which the respective connection units of a semiconductor chip and a wiring circuit substrate are electrically connected to each other, or a semiconductor device in which the respective connection units of a plurality of semiconductor chips are electrically connected to each other.

[Semiconductor Device]

A semiconductor device produced using the adhesive composition according to the present embodiment will be described below. A connection unit in the semiconductor device according to the present embodiment may be either metal joining between a bump and a wiring, or metal joining between a bump and a bump. In the semiconductor device according to the present embodiment, for example, flip chip connection of obtaining electrical connection through an adhesive composition can be employed.

FIG. 1 is a schematic cross-sectional view illustrating an embodiment of a semiconductor device (COB type connection mode of semiconductor chip and a wiring circuit substrate). The semiconductor device 100 illustrated in FIG. 1(a) comprises a semiconductor chip 1, a substrate 2 (wiring circuit substrate), and an adhesive layer 40 interposed therebetween. In the case of the semiconductor device 100, the semiconductor chip 1 has a semiconductor chip main body 10; a wiring 15 disposed on the substrate 2-side surface of the semiconductor chip main body 10; and a connection bump 30 as a connection unit disposed on the wiring 15. The substrate 2 has a substrate main body 20; and a wiring 16 as a connection unit disposed on the semiconductor chip 1-side surface of the substrate main body 20. The connection bump 30 of the semiconductor chip 1 and the wiring 16 of the substrate 2 are electrically connected by metal joining. The semiconductor chip 1 and the substrate 2 are flip-chip connected by the wiring 16 and the connection bump 30. The wirings 15 and 16 and the connection bump 30 are shielded from the external environment by being sealed by an adhesive layer 40. The adhesive layer 40 may be a cured product of the adhesive composition according to the present embodiment.

A semiconductor device 200 illustrated in FIG. 1(b) comprises a semiconductor chip 1; a substrate 2; and an adhesive layer 40 interposed therebetween. In the case of the semiconductor device 200, the semiconductor chip 1 has a connection bump 32 disposed on the substrate 2-side surface of the semiconductor chip 1, as a connection unit. The substrate 2 has a connection bump 33 disposed on the semiconductor chip 1-side surface of the substrate main body 20, as a connection unit. The connection bump 32 of the semiconductor chip 1 and the connection bump 33 of the substrate 2 are electrically connected by metal joining. The semiconductor chip 1 and the substrate 2 are flip-chip connected by the connection bumps 32 and 33. The connection bumps 32 and 33 are shielded from the external environment by being sealed by an adhesive layer 40. The adhesive layer 40 may be a cured product of the adhesive composition according to the present embodiment.

The configuration of a semiconductor device 300 illustrated in FIG. 2(a) is similar to the semiconductor device 100, except that two semiconductor chips 1 are flip-chip connected through a wiring 15 and a connection bump 30. The configuration of a semiconductor device 400 illustrated in FIG. 2(b) is similar to the semiconductor device 200, except that two semiconductor chips 1 are flip-chip connected through a connection bump 32.

The semiconductor chip main body 10 is not particularly limited, and various semiconductors such as an elemental semiconductor composed of the same kind of element such as silicon or germanium, and a compound semiconductor such as gallium arsenide or indium phosphide, can be used.

The substrate 2 is not particularly limited so long as it is a wiring circuit substrate, and a circuit substrate in which unnecessary sites of a metal layer provided on the surface of an insulating substrate containing a glass epoxy, a polyimide, a polyester, a ceramic, an epoxy, bismaleimide-triazine, or the like as a main component have been removed by etching so as to provide wiring (wiring pattern); a circuit substrate in which wiring (wiring pattern) has been provided by metal plating or the like on the surface of the above-described insulating substrate; a circuit substrate in which wiring (wiring pattern) has been provided by printing a conductive substance on the surface of the above-described insulating substrate; and the like can be used.

Examples of the material for the connection units such as the wirings 15 and 16, the connection bump 30, and the connection bumps 32 and 33 include, as main components, gold, silver, copper, solder (main components are, for example, tin-silver, tin-lead, tin-bismuth, tin-copper, and tin-silver-copper), tin, and nickel. The connection units may be composed only of a single component or may be composed of a plurality of components. The connection units may have a structure in which these metals are laminated. The metal material of the connection units may be copper or solder from the viewpoint of being relatively inexpensive. The connection units may include solder from the viewpoint of enhancing the connection reliability and suppressing warpage.

On the surface of the wirings 15 and 16 (wiring patterns), a metal layer containing gold, silver, copper, solder (main components are, for example, tin-silver, tin-lead, tin-bismuth, and tin-copper), tin, nickel, and the like as main components may be formed. The metal layer may be composed only of a single component or may be composed of a plurality of components. The metal layer may have a structure in which a plurality of metal layers are laminated. The metal layer may include relatively inexpensive copper or solder. The metal layer may include solder from the viewpoint of enhancing the connection reliability and suppressing warpage.

Figure 2:
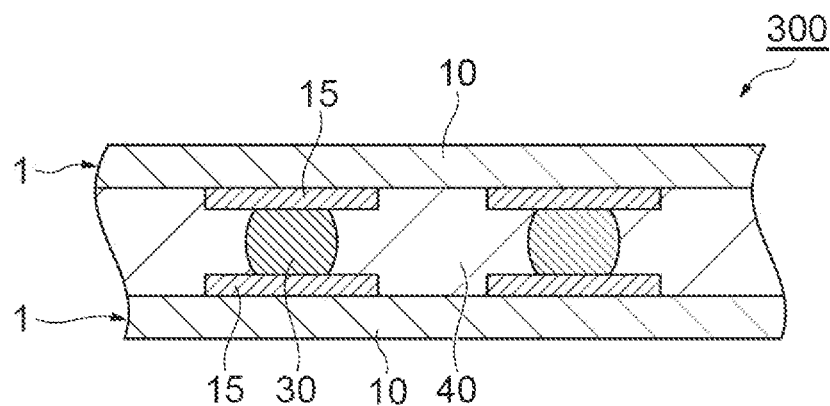
FIG. 2 is a schematic cross-sectional view illustrating another embodiment of the semiconductor device.
Figure 2:
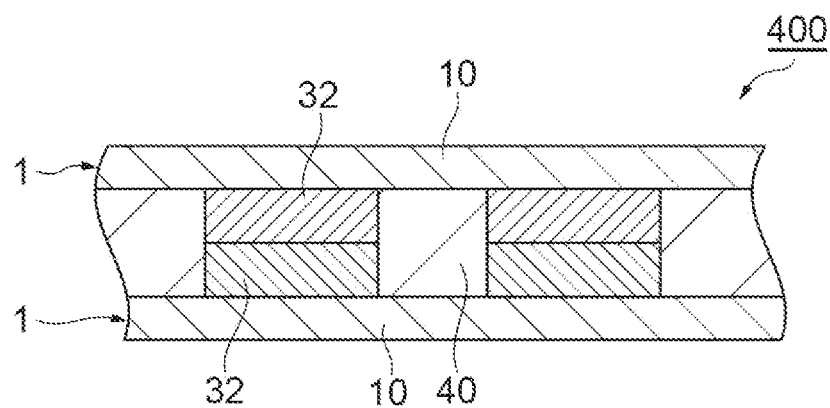

The semiconductor devices (packages) illustrated in FIG. 1 or FIG. 2 may be laminated and electrically connected by means of gold, silver, copper, solder (main components are, for example, tin-silver, tin-lead, tin-bismuth, tin-copper, and tin-silver-copper), tin, nickel, or the like. The metal for connection may be relatively inexpensive copper or solder. Electrical connection may be carried out by, for example, flip-chip connecting or laminating semiconductor chips, with an adhesive layer interposed between the semiconductor chips as can be seen in the TSV technology, forming holes penetrating through the semiconductor chips, and connecting the semiconductor chips to electrodes of patterned surfaces.

Figure 3:
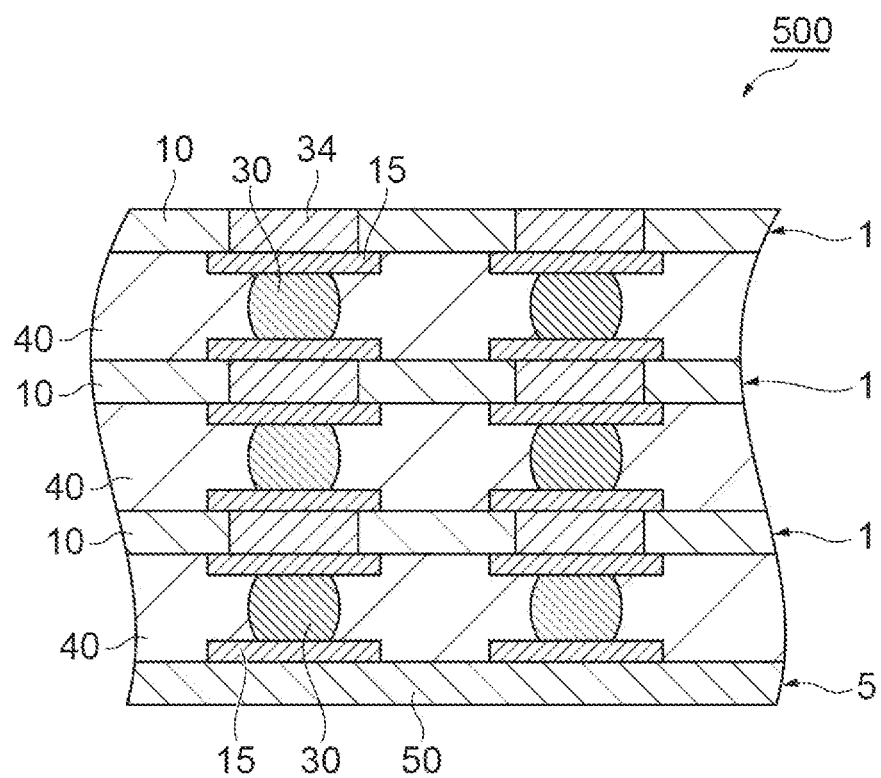
FIG. 3 is a schematic cross-sectional view illustrating a further embodiment of the semiconductor device.

FIG. 3 is a schematic cross-sectional view illustrating another embodiment of the semiconductor device (semiconductor chip laminated type embodiment (TSV)). In the semiconductor device 500 illustrated in FIG. 3, a wiring 15 provided on an interposer main body 50 as a substrate is connected to connection bumps 30 of a semiconductor chip 1, and thereby the semiconductor chip 1 and an interposer 5 are flip-chip connected. An adhesive layer 40 is interposed between the semiconductor chip 1 and the interposer 5. Semiconductor chips 1 are repeatedly laminated on the surface on the opposite side of the interposer 5 in the semiconductor chip 1, with the wiring 15, the connection bumps 30, and the adhesive layer 40 interposed therebetween. The wiring 15 of the patterned surfaces on the front and back sides of the semiconductor chips 1 are connected to one another by penetration electrodes 34, which filled the inside of the holes penetrating the interior of semiconductor chip main body 10. As the material for the penetration electrode 34, for example, copper and aluminum can be used. The adhesive layer 40 may be a cured product of the adhesive composition according to the present embodiment.

Through such a TSV technology, signal can be obtained also from the back surface of a semiconductor chip, which is usually not used. Furthermore, since the penetration electrode 34 is caused to perpendicularly pass through the interior of the semiconductor chip 1, the distance between semiconductor chips 1 that face each other, and the distance between the semiconductor chip 1 and the interposer 5 are shortened, and flexible connection is enabled. The adhesive layer 40 can be applied as a sealing material between semiconductor chips 1 that face each other and between the semiconductor chip 1 and the interposer 5 in such a TSV technology.

Furthermore, in a method for forming bumps with a high degree of freedom, such as an area bump chip technology, it is possible to directly mount a semiconductor chip on a mainboard without making use of an interposer. The adhesive composition according to the present embodiment can be applied also to a case in which such a semiconductor chip is directly mounted on a mainboard. Incidentally, the adhesive composition according to the present embodiment can also be applied when the gaps between substrates are sealed in a case in which two wiring circuit substrates are laminated.

[Method for Producing Semiconductor Device]

A method for producing a semiconductor device of the present embodiment is a method for producing a semiconductor device in which the respective connection units of a semiconductor chip and a wiring circuit substrate are electrically connected to each other, or a semiconductor device in which the respective connection units of a plurality of semiconductor chips are electrically connected to each other, the method comprising a step of sealing at least a portion of the connection units using the adhesive composition according to the present embodiment.

Figure 4:
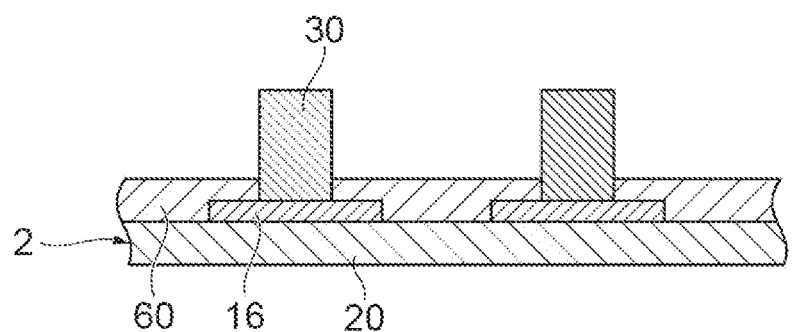
FIG. 4 is a process cross-sectional view schematically illustrating an embodiment of a method for producing a semiconductor device.
Figure 4:
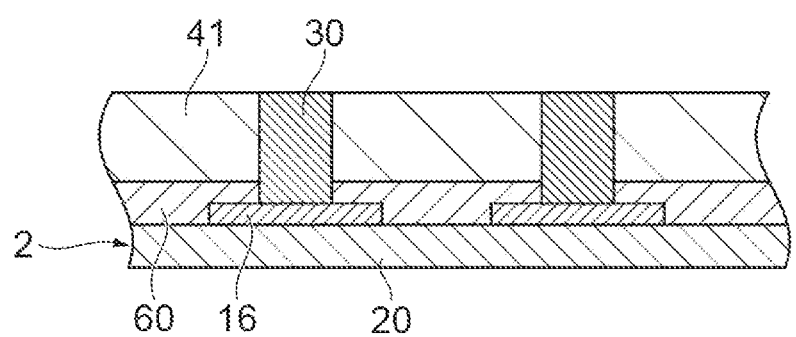
Figure 4:
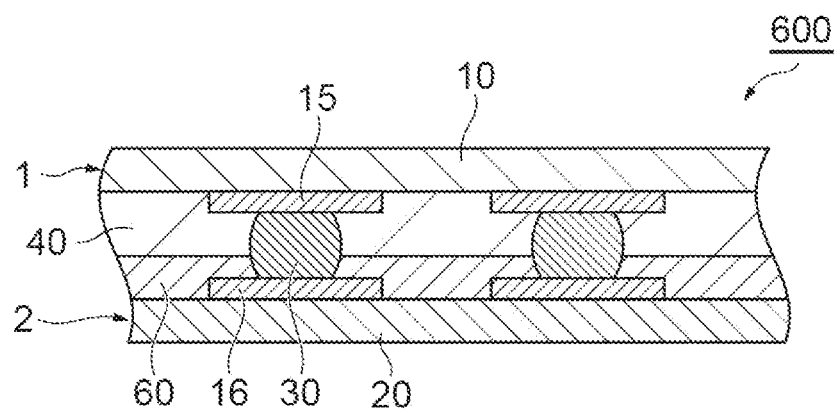

The method for producing a semiconductor device of the present embodiment will be described below using FIG. 4. FIG. 4 is a process cross-sectional view schematically illustrating an embodiment of the method for producing a semiconductor device.

First, as illustrated in FIG. 4(a), on a substrate 2 comprising a wiring 16 and a substrate main body 20, a solder resist 60 having an opening at a position where a connection bump 30 is formed is formed. It is not necessarily essential to provide this solder resist 60; however, by providing a solder resist on the substrate 2, generation of bridges between wirings is suppressed, and connection reliability and insulation reliability can be enhanced. The solder resist 60 can be formed by, for example, using a commercially available solder resist ink for packaging. Specific examples of the commercially available solder resist ink for packaging include SR series (Hitachi Chemical Co., Ltd., trade name) and PSR4000-AUS series (Taiyo Ink Manufacturing Co., Ltd., trade name).

Next, as illustrated in FIG. 4(a), a connection bump 30 is formed at an opening of a solder resist 60. Then, as illustrated in FIG. 4(b), on the substrate 2 on which the connection bump 30 and the solder resist 60 are provided, for example, a film-shaped adhesive 41 is stuck. Sticking of the film-shaped adhesive 41 can be carried out by heat pressing, roll lamination, vacuum lamination, or the like. The supply area and thickness of the film-shaped adhesive 41 are appropriately set by the sizes of the semiconductor chip 1 and the substrate 2 that will be described below, and the height of the connection bump 30.

As described above, the film-shaped adhesive 41 is stuck to the substrate 2, and then a wiring 15 of a semiconductor chip comprising the wiring 15 and a semiconductor chip main body 10 is aligned with a connection bump 30 using a connecting apparatus such as a flip-chip bonder. Subsequently, the semiconductor chip 1 and the substrate 2 are pressure-bonded while being heated at a temperature higher than or equal to the melting point of the connection bump 30, and as illustrated in FIG. 4(c), a semiconductor device 600 in which the semiconductor chip 1 and the substrate 2 are connected, and at the same time, the gap between the semiconductor chip 1 and the substrate 2 is sealed by an adhesive layer 40, which is a cured product of the film-shaped adhesive 41, can be obtained.

In the method for producing a semiconductor device of the present embodiment, the semiconductor chip 1 and the substrate 2 may be connected by aligning the semiconductor chip and the substrate, subsequently temporarily fixing them (in a state of having a film-shaped adhesive interposed therebetween), and heat-treating the assembly in a reflow furnace to melt the connection bump 30. In the stage of temporary fixing, since it is not necessarily essential to form metal joining, pressure-bonding under a low load, a short time, and a low temperature may be satisfactory as compared to the above-described method of pressure-bonding while heating, and deterioration of the connection units can be suppressed while at the same time, productivity is increased.

Furthermore, after the semiconductor chip 1 and the substrate 2 are connected, a heating treatment is carried out with an oven or the like to further enhance connection reliability and insulation reliability. The heating temperature is not particularly limited so long as it is a temperature at which curing of the film-shaped adhesive proceeds, and the heating temperature may be a temperature at which the film-shaped adhesive is completely cured. The heating conditions such as the heating temperature and the heating time are appropriately set.

In the method for producing a semiconductor device of the present embodiment, after the film-shaped adhesive 41 is stuck to the semiconductor chip 1, the substrate 2 may be connected thereto. Furthermore, after the wiring 15 of the semiconductor chip 1 and the wiring 16 of the substrate 2 are connected by a connection bump 30, the adhesive composition may be charged into the gap between the semiconductor chip 1 and the substrate 2 and cured.

From the viewpoint that productivity is increased, a structure in which the adhesive composition has been supplied on the semiconductor chip 1 may be obtained by supplying the adhesive composition to a semiconductor wafer to which a plurality of semiconductor chips 1 are connected, and then dividing the semiconductor wafer into individual pieces by dicing. Furthermore, in a case in which the adhesive composition is in a paste form, there are no particular limitations; however, the wiring or bumps on the semiconductor chip 1 may be embedded by a coating method such as spin coating, and the thickness may be made uniform. In this case, since the supply amount of the resin becomes constant, productivity is increased, and at the same time, generation of voids caused by insufficient embedding, and deterioration of the dicing properties can be suppressed. On the other hand, in a case in which the adhesive composition is in a film form, there are no particular limitations; however, the adhesive composition in a film form may be supplied so as to embed the wiring or bumps on the semiconductor chip 1 by sticking systems such as heat pressing, roll lamination, and vacuum lamination. In this case, since the supply amount of the resin becomes constant, productivity is increased, and generation of voids caused by insufficient embedding, and deterioration of the dicing properties can be suppressed.

As compared to a method of spin coating an adhesive composition in a paste form, when a method of laminating an adhesive composition in a film form is used, the flatness of the adhesive composition after supply tends to become satisfactory. Therefore, the form of the adhesive composition is preferably a film form. Furthermore, a film-shaped adhesive is also excellent in terms of applicability to a variety of processes, handleability, and the like.

Furthermore, in a method of supplying the adhesive composition by laminating a film-shaped adhesive, the connectivity of the semiconductor device tends to be more easily secured.

The connection load is set in consideration of the fluctuation in the number and height of the connection bumps 30, and the quantity of deformation of the connection bumps 30 or the wiring that receives the bumps of the connection units caused by pressurization. The temperature of the connection unit may be higher than or equal to the melting point of the connection bump 30; however, the connection temperature may be a temperature at which metal joining of the respective connection units (bumps or wirings) is formed. In a case in which the connection bump 30 is a solder bump, the connection temperature is about 240° C. or higher.

The connection time at the time of connection may vary depending on the constituent metal of the connection unit; however, from the viewpoint that productivity is increased, it is preferable that the connection time is a short time. In a case in which the connection bump 30 is a solder bump, the connection time may be 20 seconds or less, 10 seconds or less, or 5 seconds or less. In the case of metal connection of copper-copper or copper-gold, the connection time may be 60 seconds or less.

EXAMPLES

Hereinafter, the present invention will be more specifically described by way of Examples. However, the present invention is not intended to be limited to these Examples.

The components used in Examples and Comparative Examples are as follows.

(a) Resin Component
(a1) Resin Having Maleimide Group
SFR2300 (trade name) (bismaleimide resin represented by the above-described Formula (A) (mixture of n=1 to 10), Hitachi Chemical Co., Ltd., glass transition point (Tg): 75° C. to 80° C., weight average molecular weight (Mw): about 17000)
(a2) Resin that does not have Maleimide Group
FX293 (trade name) (phenoxy resin, NSCC Epoxy Manufacturing Co., Ltd., glass transition point (Tg): about 163° C., weight average molecular weight (Mw): about 44000)

(b) Thermal Crosslinking Agent
EA0200 (trade name) (fluorene type acrylic resin having a fluorene skeleton, solid at 25° C., Osaka Gas Chemicals Co., Ltd., number of functional groups: 2)
(c) Curing Agent
PERCUMYL D (trade name) (dicumyl peroxide, NOF CORPORATION)
(d) Flux Agent
Glutaric acid (Sigma Aldrich Japan LLC, melting point: about 98° C.)
(e) Filler
SE2050 (trade name) (silica filler (inorganic filler), Admatechs Co., Ltd., average particle size: 0.5 µm)
YA050C-SM (trade name) (methacryl-surface treated nanosilica filler (inorganic filler), Admatechs Co., Ltd., average particle size: 50 nm)
EXL-2655 (trade name) (core-shell type organic fine particles (resin filler), Rohm & Haas Japan K.K.)

<Production of Film-Shaped Adhesive>

Example 1

30 parts by mass of a thermal crosslinking agent (EA0200), 0.5 parts by mass of a flux agent (glutaric acid), 75 parts by mass of an inorganic filler (SE2050 and YA050C-SM) (SE2050: 30 parts by mass, YA050C-SM: 45 parts by mass), 10 parts by mass of a resin filler (EXL-2655), and cyclohexanone (amount with which the solid content became 60% by mass) were introduced into a vessel of a bead mill (planetary fine pulverizer, Fritsch Japan Co., Ltd., trade name: P-7), and beads having a diameter of 1.0 mm and beads having a diameter of 2.0 mm were further added thereto in an amount of the same mass as the solid content. This was stirred for 30 minutes in a bead mill, subsequently 30 parts by mass of a resin component having a maleimide group (SFR2300) was added thereto, and the mixture was further stirred for 30 minutes in the bead mill. Subsequently, 0.5 parts by mass of a curing agent (PERCUMYL D) was added thereto, the mixture was stirred in the bead mill, the beads used for stirring were removed by filtration, and thereby an adhesive varnish was obtained.

The adhesive varnish thus obtained was applied on a base material film (polyester film that had been subjected to a mold release treatment, Teijin Film Solutions, Ltd., trade name: PUREX A53) using a small-sized precision coating apparatus (Yasui Seiki, Inc.) and was dried for 5 minutes at 100° C. using a clean oven (ESPEC CORP.), and thus a film-shaped adhesive of Example 1 was obtained.

Example 2 and Comparative Example 1

Film-shaped adhesives of Example 2 and Comparative Example 1 were obtained in the same manner as in Example 1, except that the compositions of the components used were changed as shown in Table 1.

<Measurement of Dielectric Loss Tangent (DF Value)>

Each of the film-shaped adhesives produced in Examples and Comparative Examples was heated for 2 hours at 175° C. to cure, and a measurement sample having a predetermined size (100 mm (length)×100 mm (width)×200 µm (thickness)) was produced. The dielectric loss tangent (DF value) of the measurement sample was measured at a frequency of 10 GHz using a SPDR dielectric resonator (Agilent Technologies, Inc.). The results are presented in Table 1.

<Production of Semiconductor Device>

Each of the film-shaped adhesives produced in Examples and Comparative Examples was cut out into a predetermined size (7.3 mm (length)×7.3 mm (width)×0.045 mm (thickness)), and the cut film-shaped adhesive was laminated on a solder bump-attached semiconductor chip (chip size: 7.3 mm (length)×7.3 mm (width)×0.05 mm (thickness), bump height (total height of copper pillar and solder): about 45 μm, number of bumps: 1048 pins, pitch: 80 μm, Walts Co., Ltd., trade name: WALTS-TEG CC80) using a vacuum laminator (Nikko Materials Co., Ltd., trade name: Y-130) at a lamination temperature of 80° C., a lamination pressure of 0.5 MPa, and a lamination time of 60 seconds. Subsequently, the film-shaped adhesive in the solder bump-attached semiconductor chip laminated with the film-shaped adhesive was mounted on a semiconductor chip (chip size: 10 mm×10 mm×0.1 mm, connection unit metal: Ni/Au, Walts Co., Ltd., trade name: WALTS-TEG IP80) using a flip mounting apparatus (Panasonic Corporation, trade name: FCB3). The mounting conditions were set to a pressure-bonding force of 75 N, pressure-bonding was performed at a pressure-bonding temperature of 80° C. and a pressure-bonding time of 0.5 seconds, and then continuously in a pressure-bonded state, pressure-bonding was further performed at a pressure-bonding temperature of 260° C. and a pressure-bonding time of 3 seconds. Next, the semiconductor chip after mounting was subjected to after-cure (175° C., 2 hours) in a clean oven (ESPEC CORP.), and thereby semiconductor devices of Example 1, Example 2, and Comparative Example 1 were produced.

<Evaluation of Initial Connectivity>

The connection resistance values of the semiconductor devices produced as described above were measured using a multimeter (ADVANTEST CORPORATION, trade name: R6871E), and the initial conduction after mounting was evaluated. A case in which the initial connection resistance value of a peripheral portion of the semiconductor device was 30 to 35Ω was rated as "A", and a case in which the initial connection resistance value was less than 30Ω, a case in which the initial connection resistance value was more than 35Ω, or a case in which the resistance value was not displayed due to connection failure, was evaluated as "B". The results are presented in Table 1.

<Evaluation of Voids>

For the semiconductor devices produced as described above, images of the external appearance were taken by an ultrasonographic diagnosis apparatus (Insight Co., Ltd., trade name: Insight-300), and an image of a layer formed of the film-shaped adhesive on the semiconductor chip was taken with a scanner (Seiko Epson Corporation, trade name: GT-9300UF). Void portions were identified by tone correction and black and white conversion using an image processing software (Adobe Systems, Inc., trade name: Adobe Photoshop (registered trademark)), and the proportion occupied by the void portions was calculated using a histogram. When the area of the adhesive portion on the semiconductor chip was designated as 100%, a case in which the void generation ratio was 5% by area or less was rated as "A", and a case in which the void generation ratio was more than 5% by area was evaluated as "B". The results are presented in Table 1.

<Evaluation of Reflow Resistance>

A semiconductor device produced as described above was subjected to high-temperature moisture absorption under the conditions of JEDEC Level 1, and then the semiconductor device was passed three times through a reflow furnace (TAMURA CORPORATION). The connectivity of the semiconductor device after reflow was evaluated by a method similar to that for the evaluation of the initial connectivity, and a case in which there was no detachment and satisfactory connection was achieved was rated as "A", while a case in which detachment or connection failure occurred was rated as "B". The results are presented in Table 1.

TABLE 1

|  |  |  | Example 1 | Example 2 | Comparative Example 1 |
|---|---|---|---|---|---|
| Component (a) | Component (a1) | SFR2300 | 30 | 30 | — |
|  | Component (a2) | FX293 | — | — | 30 |
| Component (b) |  | EA0200 | 30 | 30 | 30 |
| Component (c) |  | PERCUMYL D | 0.5 | 0.5 | 0.5 |
| Component (d) |  | Glutaric acid | 4 | 4 | 4 |
| Component (e) |  | SE2050 | 30 | 30 | 30 |
|  |  | YA050C-SM | 45 | 30 | 45 |
|  |  | EXL-2655 | 10 | 10 | 10 |
| Dielectric loss tangent (DF value, frequency 10 GHz) |  |  | 0.007 | 0.007 | 0.012 |
| Initial connectivity |  |  | A | A | A |
| Void |  |  | A | A | A |
| Reflow resistance |  |  | A | A | B |

As shown in Table 1, cured products of the adhesive compositions of Examples 1 and 2 had lower dielectric loss tangents (DF values) than a cured product of the adhesive composition of Comparative Example 1. Furthermore, the semiconductor devices of Examples 1 and 2 comprising the cured products of the adhesive compositions of Examples 1 and 2 were excellent in the various evaluations.

From the above-described results, it was verified that the adhesive composition of the present invention is capable of sufficiently lowering the dielectric loss tangent (DF value).

REFERENCE SIGNS LIST

1 . . . semiconductor chip, 2 . . . substrate, 10 . . . semiconductor chip main body, 15, 16 . . . wiring, 20 . . . substrate main body, 30, 32, 33 . . . connection bump, 34 . . . penetration electrode, 40 . . . adhesive layer, 41 . . . film-shaped adhesive, 50 . . . interposer main body, 100, 200, 300, 400, 500, 600 . . . semiconductor device.

The invention claimed is:

1. An adhesive composition comprising:
a resin component;
a thermal crosslinking agent; and
a curing agent,
wherein the resin component comprises a resin having a maleimide group.

2. The adhesive composition according to claim 1, wherein the thermal crosslinking agent comprises an acrylic resin.

3. The adhesive composition according to claim 2, wherein the acrylic resin is solid at 25° C.

4. The adhesive composition according to claim 1, wherein the curing agent comprises a thermal radical generator.

5. The adhesive composition according to claim 4, wherein the thermal radical generator is an organic peroxide.

6. The adhesive composition according to claim 1, wherein the adhesive composition is in a film form.

7. A semiconductor device comprising:
a semiconductor chip;
a first connection unit of the semiconductor chip;
a wiring circuit substrate; and
a second connection unit of the wiring circuit substrate electrically connected to the first connection unit,
wherein the adhesive composition according to claim 1 is used for sealing the first connection unit and for sealing the second connection unit during the production of the semiconductor device.

8. A semiconductor device comprising:
a first semiconductor chip;
a first connection unit of the first semiconductor chip;
a second semiconductor chip; and
a second connection unit of the second semiconductor chip electrically connected to the first connection unit,
wherein the adhesive composition according to claim 1 is used for sealing the first connection unit and for sealing the second connection unit during the production of the semiconductor device.

9. A method for producing a semiconductor device having a plurality of connection units for connecting a semiconductor chip and a wiring circuit substrate to each other, or for connecting a plurality of semiconductor chips to each other, the method comprising:
electrically connecting a first connection unit to a second connection unit; and
sealing at least a portion of the first and second connection units using the adhesive composition according to claim 1.

* * * * *